(12) United States Patent
Chien

(10) Patent No.: US 11,644,744 B2
(45) Date of Patent: May 9, 2023

(54) DISPLAY PANEL, MANUFACTURING METHOD OF DISPLAY PANEL AND MASK USED THEREOF

(71) Applicants: HKC Corporation Limited, Shenzhen (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); Chongqing HKC Optoelectronics Technology Co., Ltd., Chongqing (CN)

(*) Notice: Subject to any disclaimer, the term of this patent is extended or adjusted under 35 U.S.C. 154(b) by 603 days.

(21) Appl. No.: 16/461,380

(22) PCT Filed: May 10, 2017

(86) PCT No.: PCT/CN2017/083787
§ 371 (c)(1),
(2) Date: May 16, 2019

(87) PCT Pub. No.: WO2018/113168
PCT Pub. Date: Jun. 28, 2018

(65) Prior Publication Data
US 2021/0124255 A1 Apr. 29, 2021

(30) Foreign Application Priority Data
Dec. 20, 2016 (CN) .......................... 201611194904.8

(51) Int. Cl.
*G03F 1/38* (2012.01)
*G03F 7/028* (2006.01)
*G02F 1/1339* (2006.01)

(52) U.S. Cl.
CPC ............ *G03F 1/38* (2013.01); *G02F 1/13394* (2013.01); *G02F 1/13396* (2021.01); *G03F 7/028* (2013.01)

(58) Field of Classification Search
CPC .... G02F 1/13396; G02F 1/13394; G03F 1/38; G03F 1/028
See application file for complete search history.

(56) References Cited

U.S. PATENT DOCUMENTS

2002/0142234 A1* 10/2002 Hansel ...................... G03F 1/54
430/5
2012/0242939 A1* 9/2012 Li ..................... G02F 1/133514
359/891

FOREIGN PATENT DOCUMENTS

CN 101373323 A 2/2009
CN 101398612 A 4/2009
(Continued)

OTHER PUBLICATIONS

Machine translation of JP 2000-314804 (2000).*
(Continued)

*Primary Examiner* — Martin J Angebranndt

(57) ABSTRACT

The present application discloses a display panel, a manufacturing method of a display panel and a mask used thereof. The manufacturing method of the display panel comprises the following steps: doping a photo-initiator in photoresist for manufacturing photo spacers; coating the photoresist on the substrates to form photo spacers, and arranging a shade on the same layer; and respectively irradiating corresponding photo spacers by at least two types of light rays of different wavelengths, to control the photo-initiator so as to enable different photo spacers to have different shrinkages.

6 Claims, 8 Drawing Sheets

(56) References Cited

FOREIGN PATENT DOCUMENTS

| | | | | |
|---|---|---|---|---|
| CN | 106054531 | A | | 10/2016 |
| CN | 106094358 | A | | 11/2016 |
| CN | 106125391 | A | | 11/2016 |
| CN | 106526948 | A | | 3/2017 |
| JP | 09045606 | A | * | 2/1997 |
| JP | 11-212075 | | * | 8/1999 |
| JP | 2000-314804 | | * | 11/2000 |
| JP | 2002258462 | A | | 9/2002 |
| JP | 2004-240136 | | * | 8/2004 |
| JP | 2005091853 | A | | 4/2005 |
| JP | 2006-039243 | | * | 2/2006 |
| JP | 2006-098559 | | * | 4/2006 |
| JP | 2006119327 | A | * | 5/2006 |
| JP | 2007-188064 | | * | 7/2007 |
| JP | 2008-181038 | | * | 8/2008 |
| JP | 2009151071 | A | * | 7/2009 |
| JP | 2010014870 | A | * | 1/2010 |
| JP | 5182029 | B2 | * | 4/2013 |
| JP | 2013-101361 | | * | 5/2013 |
| KR | 2004-0104799 | | * | 12/2004 |

OTHER PUBLICATIONS

Machine translation of JP 2004-240136 (2004).*
Machine translation of JP 2007-188064 (2007).*
Machine translation of JP 2013-101361 (2013).*
Machine translation of JP 11-212075 (1999).*
Machine translatino of JP 2006-039243 (2006).*
Machine translation of JP 2006-098559 (2006).*
Machine translation of JP 2008-181038 (2008).*
Machine translation of KR 2004-0104799 (2004).*
Yunli Liu, the ISA written comments, Sep. 2017, CN.
Yunli Liu, the International Search Report, dated Sep. 2017, CN.

* cited by examiner

DISPLAY PANEL, MANUFACTURING METHOD OF DISPLAY PANEL AND MASK USED THEREOF

TECHNICAL FIELD

The present application relates to the technical field of displays, and more particularly to a display panel, a manufacturing method of a display panel and a mask used thereof.

BACKGROUND

Liquid crystal display apparatuses (LCD apparatuses) have numerous advantages, such as a thin body, power savings, no radiation, etc., and are widely used. Most liquid crystal display apparatuses in the current market are backlit liquid crystal display apparatuses, each including a liquid crystal panel and a backlight module. Working principle of the liquid crystal panel is that liquid crystals are put in two parallel glass substrates, and a driving voltage is applied to two glass substrates to control rotation direction of the liquid crystals, to refract light rays of the backlight module to generate a picture.

Thin film transistor-liquid crystal display apparatuses (TFT-LCD apparatuses) currently maintain a leading status in the display field because of low power consumption, excellent picture quality, high production yield, and other properties. Similarly, the thin film transistor-liquid crystal display apparatus includes liquid crystal panel and a backlight module. The liquid crystal panel includes a color filter substrate (CF substrate) and a thin film transistor substrate (TFT substrate), and transparent electrodes on relative inner sides of the above substrates. A layer of liquid crystals (LC) is positioned between two substrates. The liquid crystal panel changes a polarized state of light by controlling the direction of the LCs through an electric field, for penetration and obstruction of a light path via a polarized plate to display.

In present manufacturing method of liquid crystal panels, for example, in manufacturing method of a color filter substrate, a color filter layer (f e.g. R/G/B photoresist), a light shading layer [e.g. black matrix (BM) layer] and a photo spacer layer [e.g. photo spacer (PS) photoresist] are done through repeated photoresist coating, exposure and development, and then color filter substrate finished product is formed. Because the color light filter layer, the light shading layer and the support layer are respectively done using different techniques, the manufacturing method thereof is complicated.

SUMMARY

A technical problem to be solved by the present application is to provide a manufacturing method of a display panel saving manufacturing techniques.

The aim of the present invention is realized by the following methods.

According to one aspect of the present application, the present application discloses a manufacturing method of a display panel, the display panel comprising a substrate, the manufacturing method comprising the following steps:

doping a photo-initiator in photoresist for manufacturing photo spacers;

coating the photoresist on the substrates to form photo spacers, and arranging a shade on the same layer; and respectively irradiating corresponding photo spacers by at least two types of light rays of different wavelengths, to control the photo-initiator so as to enable different photo spacers to have different shrinkages.

Optionally, in the step of doping a photo-initiator in photoresist for manufacturing photo spacers, the photo-initiator is further doped in photoresist for manufacturing shades. The shade in the present application is equivalent to the light shading layer [black matrix layer(BM layer)] in the display panel in the prior art. Because the photo-initiator is doped in the photoresist for manufacturing shades, when being irradiated by light rays of different wavelengths, the shade also produces a cross-linking reaction with the photo-initiator, to form a shrinkage so as to control the height of the shade.

Optionally, in the step of respectively irradiating corresponding photo spacers by at least two types of light rays of different wavelengths, to control the photo-initiator so as to enable different photo spacers to have different shrinkages, a mask is irradiated using the same light source, to filter different wavelengths of light rays through the mask. In this way, in the manufacturing method of the display panel, the same light source may be directly used, so that the light source is simply used without irradiating for many times using different light sources. For the same light source, under the filtering action of the mask, different wavelengths of light rays are filtered, and then the shrinkages of different photo spacers are controlled by the cooperation between different wavelengths of the light rays and the photo-initiator, to control the mismatch between the first photo spacer and the second photo spacer.

Optionally, The photo spacers include at least two of the photo spacers including a first photo spacer and a second photo spacer mismatched with the first photo spacer, and photo-initiators in both the photo spacers are identical. Identical photo-initiators are arranged in different photo spacers. Irradiated by different wavelengths of light rays, the different photo spacers produce different degrees of cross-linking reactions, so that the different photo spacers form different degrees of shrinkages, thereby achieving a mismatch forms between different photo spacers. In the present application, different wavelengths of the light rays are configured to irradiate the identical photo-initiators and the photo spacers, and the different photo spacers are controlled to produce different degrees of the cross-linking reactions under the effect of the light rays of different wavelengths, so as to further control the shrinkages of the different photo spacers. Control effect is good, so that the mismatch between the different photo spacers achieves a preset need. Furthermore, for such configuration on a production technique, the different photo spacers are not required to be configured differently, and the configuration thereof is simple.

Optionally, The photo-initiator is arranged in the shade, the shade is configured to have an equal height to the second photo spacer, the first photo spacer is configured to be higher than the second photo spacer, and the second photo spacer is positioned between the first photo spacer and the shade. The shade in the present application is equivalent to the light shading layer [black matrix layer (BM layer)] in the display panel in the prior art. Because the identical photo-initiator are arranged in the photo spacer and the shade, when being irradiated by different wavelengths of light rays, the shade also produces a cross-linking reaction with the photo-initiator, to form a shrinkage so as to control the height of the shade. Moreover, the first photo spacer is configured to be higher than the second photo spacer and the shade, the second photo spacer is configured to have an equal height to the shade, and the second photo spacer is positioned between the first photo spacer and the shade. In this way, the control for the mismatch is better, so that the display of the display panel is better.

Optionally, The mismatch value between the first photo spacer and the second photo spacer is greater than or equal to 0.5 um. When the mismatch value between the first photo spacer and the second photo spacer is less than 0.5 um, the display of the display panel is greatly affected, and other manufacturing methods are affected, so that the difficulty of the entire display panel is increased. In the present application, the shrinkages of the different photo spacers are controlled under the cooperation between different wavelengths of the light rays and the photo-initiator, to control the mismatch between the first photo spacer and the second photo spacer to be greater than or equal to 0.5 um, thereby facilitating the successful manufacturing of the entire display panel and avoiding affecting the display of the display panel due to a limited mismatch value.

Optionally, The photo-initiators in at least two of the photo spacers are different. Different photo-initiators correspond to different wavelengths of light rays respectively. The different wavelengths of light rays cooperate with the different photo-initiators respectively. Therefore, irradiated by different wavelengths of light rays, the different photo-initiators produce different degrees of cross-linking reactions with the different photo spacers respectively, so that different degrees of shrinkages are formed, thereby achieving that a mismatch is formed between different photo spacers.

According to another aspect of the present application, the present application further discloses a mask applied to the manufacturing method of a display panel, and the mask includings:

a light filter layer including at least three light filter portions including a first light filter portion corresponding to the first photo spacer, a second light filter portion corresponding to the second photo spacer and a third light filter portion corresponding to the shade, where the first light filter portion is only used for light rays of the first wavelength to pass through, and the second light filter portion and the third filter portion are only used for light rays of the second wavelength to pass through.

a light shading layer including a first light shading block, a second light shading block, a third light shading block and a fourth light shading block, wherein the first light filter portion is positioned between the first light shading block and the second light shading block, the second light filter portion is positioned between the second light shading block and the third light shading block, and the third light filter portion is positioned between the third light shading block and the fourth light shading block; and a carrier transparently arranged, and the light filter layer and the light shading layer are disposed on the carrier.

Optionally, the light filter portion includes a metal grating used for preset wavelength of light rays to pass through. The metal grating filters preset wavelength of light rays, and only allows preset wavelength of the light rays to pass through, to filter out other wavelengths of light rays, to prevent other wavelengths of the light rays from passing through.

Optionally, the light filter portion includes a transparent medium used for preset wavelengths of light rays to pass through. The transparent medium allows preset wavelengths of light rays to pass through, in other words, the transparent medium allows light rays with the same color to pass through; and absorbs other wavelengths of light rays, to prevent other wavelengths of the light rays from passing through, in other words, absorbs other colors of light rays, to prevent other colors of light rays from passing through.

Optionally, the light filter portion includes a metal grating and a transparent medium which are used for preset wavelength of light rays to pass through, where the metal grating is stacked on the transparent medium. The metal grating filter preset wavelength of light rays, and only allows preset wavelength of the light rays to pass through, to filter out other wavelengths of light rays, to prevent other wavelengths of the light rays from passing through. The transparent medium allows preset wavelength of light rays to pass through, in other words, the transparent medium allows light rays with the same color to pass through; and absorbs other wavelengths of light rays, to prevent other wavelengths of the light rays from passing through. Here, the metal grating is stacked on the transparent medium, to guarantee that transparent areas may be completely overlapped, to enable the metal grating and the transparent medium to act together. The metal grating achieves filtration, and the transparent medium achieves absorption. In this way, the light filter effect is better.

Optionally, the light filter portion includes a metal grating and a transparent medium which are used for preset wavelength of light rays to pass through, where the transparent medium is stacked on the metal grating.

Optionally, the light filter layer is directly disposed on the carrier, and the light shading layer is directly disposed on the light filter layer. This is one specific manner of arranging each layer of the mask. The carrier plays a bearing role. Because the light shading layer is directly disposed on the light filter layer, the light shading effect of the light shading layer is better.

Optionally, the light filter layer is directly disposed on the carrier, the light shading layer is directly disposed on the carrier, and at least three of the light filter portions are arranged among the light shading layers at intervals. This is another manner of arranging each layer of the mask. Such arrangement may save space occupied by the light filter layer and save light filter layer material.

Optionally, the carrier includes a transparent glass substrate. The glass substrate plays a support role and bears a first light shading layer and the light filter layer, and the transparent glass substrate has a good transparent effect. Moreover, the glass substrate in the mask of the present application may be made of quartz glass which is easily obtained.

Optionally, the carrier includes a metal film, where the metal film is provided with a through hole for light rays to pass through. The metal film plays a support role and bears the first light shading layer and the light filter layer, and the metal film has high intensity and has a good bearing effect. Furthermore, the through hole is provided in the metal film for light rays to pass through.

According to yet another aspect of the present application, the present application further discloses a display panel including:

a substrates; and a photo spacers disposed on the substrates, where photo-initiators used to cooperate with preset wavelength of light rays to control the shrinkages of the photo spacers are arranged in the photo spacers; and a shade, wherein the photo spacers are positioned between the substrates, and the shade and the photo spacers are disposed on the same layer.

Optionally, the photo spacers include at least two of the photo spacers including a first photo spacer and a second photo spacer mismatched with the first photo spacer, and the photo-initiators in both the photo spacers are identical. Identical photo-initiators are arranged in different photo spacers. Irradiated by different wavelengths of light rays, the different photo spacers produce different degrees of cross-linking reactions, so that the different photo spacers form different degrees of shrinkages, thereby achieving that a mismatch exists between different photo spacers. In the present application, different wavelengths of the light rays are configured to irradiate the identical photo-initiators and the photo spacers, and the different photo spacers are controlled to produce different degrees of the cross-linking reactions under the effect of the light rays of different wavelengths, so as to further control the shrinkages of the different photo spacers. Control effect is good, so that the mismatch between the different photo spacers achieves a preset need. Furthermore, for such configuration on a production technique, the different photo spacers are not required to be configured differently, and the configuration thereof is simple.

Optionally, the photo-initiator is arranged in the shade, the shade is configured to have an equal height to the second photo spacer, the first photo spacer is configured to be higher than the second photo spacer, and the second photo spacer is positioned between the first photo spacer and the shade. The shade in the present application is equivalent to the light shading layer [black matrix layer(BM layer)] in the display panel in the prior art. Because the identical photo-initiator are arranged in the photo spacer and the shade, when being irradiated by different wavelengths of light rays, the shade also produces a cross-linking reaction with the photo-initiator, to form a shrinkage, to control the height of the shade. Moreover, the first photo spacer is configured to be higher than the second photo spacer and the shade, the second photo spacer is configured to have an equal height to the shade, and the second photo spacer is positioned between the first photo spacer and the shade. In this way, the control for the mismatch is better, so that the display of the display panel is better.

Optionally, the mismatch value between the first photo spacer and the second photo spacer is greater than or equal to 0.5 um. When the mismatch value between the first photo spacer and the second photo spacer is less than 0.5 um, the display of the display panel is greatly affected, and other manufacturing methods are affected, so that the difficulty of the entire display panel is increased. In the present application, the shrinkages of the different photo spacers are controlled under the cooperation between different wavelengths of the light rays and the photo-initiator, to control the mismatch between the first photo spacer and the second photo spacer to be greater than or equal to 0.5 um, thereby facilitating the successful manufacturing of the entire display panel and avoiding affecting the display of the display panel due to a limited mismatch value.

Optionally, the photo-initiators in at least two of the photo spacers are different. Different photo-initiators correspond to different wavelengths of light rays respectively. The different wavelengths of light rays cooperate with different photo-initiators respectively. Thus, irradiated by different wavelengths of light rays, the different photo-initiators produce different degrees of cross-linking reactions with the different photo spacers respectively, so that different degrees of shrinkages are formed, thereby achieving that a mismatch is formed between different photo spacers.

Optionally, in the manufacturing method of the display panel of the present application, the photo spacers and the shade are disposed on the same layer of the substrate, and in the same manufacturing method, the photo spacers and the shade are processed simultaneously, so that manufacturing techniques of the display panel are saved.

Furthermore, in the present application, a photo-initiator is further arranged in photoresist for manufacturing photo spacers. The photo-initiator is used to cooperate with preset wavelength of light rays. Irradiated by different wavelengths of light rays, the photo-initiator produces different cross-linking reactions with the different photo spacers. Specifically, irradiated by different wavelengths of the light rays, the photo-initiator produces different cross-linking reactions with the different photo spacers, so that the shrinkages of the different photo spacers are different, thereby controlling the mismatch between every two photo spacers to be within an appropriate range, and making the mismatch between every two photo spacers meet various design requirements.

DETAILED DESCRIPTION

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that tens such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated apparatus or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly comprise one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation", "bonded" and "bonding" shall be understood in broad sense, and for example, may refer to fixed bonding or detachable bonding or integral bonding, may refer to mechanical bonding or electrical bonding, and may refer to direct bonding or indirect bonding through an intermediate medium or inner communication of two elements. For those of ordinary skill in the art, the meanings of the above terms in the present application may be understood according to concrete conditions.

The terms used herein are intended to merely describe concrete embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The display panel, the manufacturing method of a display panel, the display apparatus and the mask of the present application are described below with reference to FIG. 1 to FIG. 9.

Figure 1:
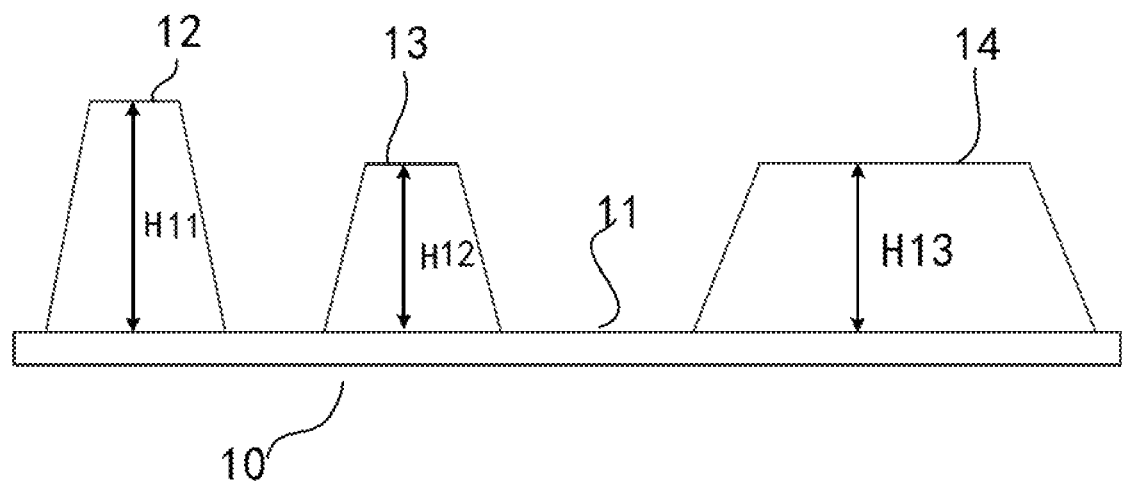
FIG. 1 is a partial structural schematic diagram of a display panel of the present application.

The applicant already designs a display panel. As shown in FIG. 1, FIG. 1 is a partial structural schematic diagram of a display panel of the present application. Specifically, a plurality of photo spacers and a shade 14 are disposed on the same layer of the substrate 11 of the display panel 10, where the photo spacers include a first photo spacer 12 and a second photo spacer 13. Thus, in the manufacturing method of the display panel 10, the photo spacers and the shade may be arranged at the same time. In this way, compared with existing manufacturing method of a display panel, manufacturing methods are saved, so that the manufacturing method of the display panel is simple.

However, in the actual manufacturing method of the display panel, the applicant finds that the mismatch between different photo spacers is limited. In general, the mismatch between different photo spacers is less than 0.5 um. Specifically, the height difference between the height H1 of the first photo spacer 12 and the height H12 of the second photo spacer 13 is less than 0.5 um. Thus, in the manufacturing method of the display panel, the control on the height H11 of the first photo spacer 12, the height H12 of the second photo spacer 13 and the height H13 of the shade 14 is limited.

Therefore, the applicant also designs another technical solution to solve the above technical problem specifically:

The present application will be further described in detail below in combination with FIG. 2 to FIG. 9 and preferred embodiments.

Figure 2:
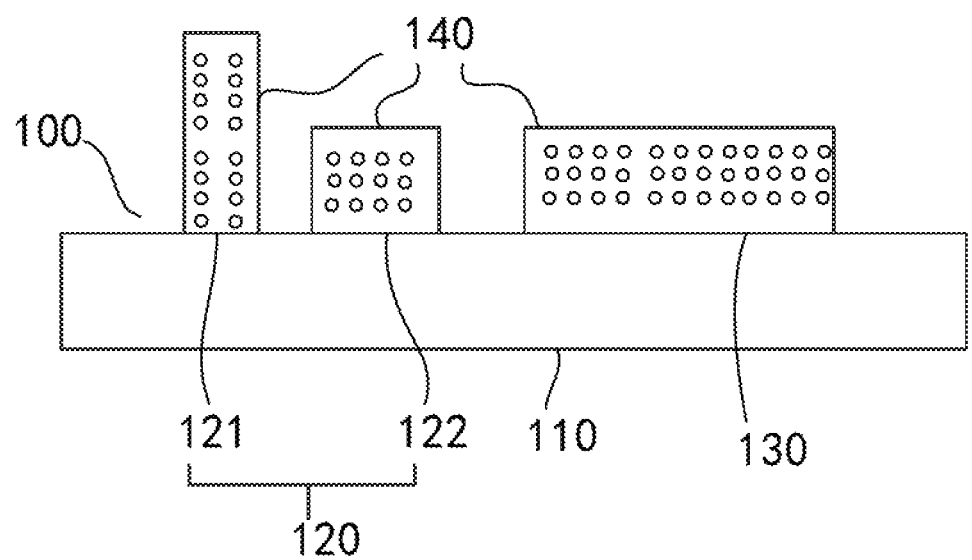
FIG. 2 is a partial structural schematic diagram of a display panel in an embodiment of the present application.
Figure 3:
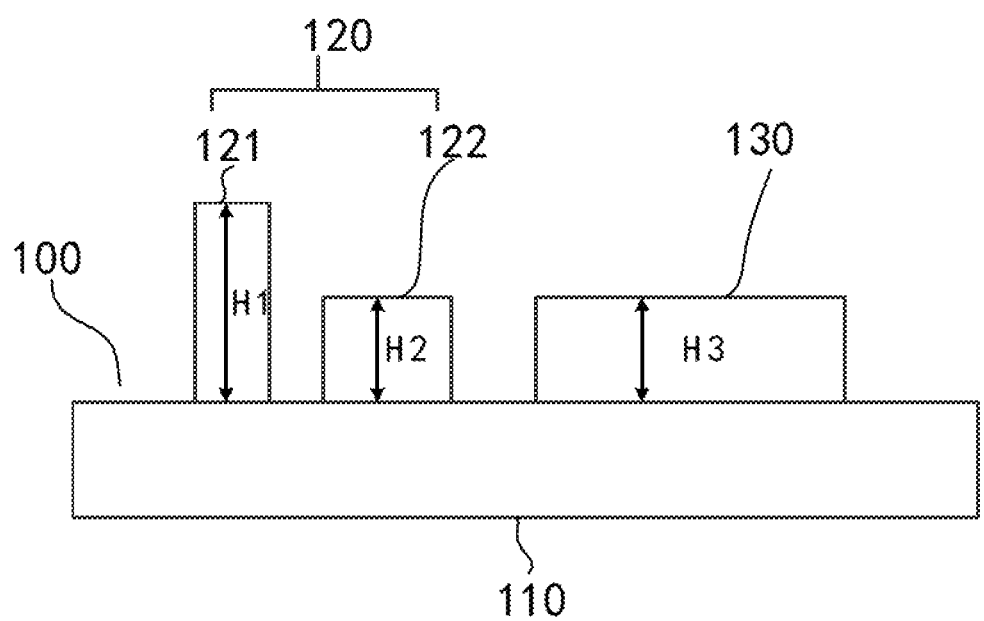
FIG. 3 is a partial structural schematic diagram of a display panel in an embodiment of the present application.

According to an embodiment of the present application, as shown in FIG. 2 and FIG. 3, an embodiment of the present application discloses a display panel, the display panel comprising substrates 110, photo spacers 120 and a shade 130, where the photo spacers 120 are disposed on the substrates 110, and photo-initiators 140 configured to cooperate with preset wavelength of light rays to control the shrinkages of the photo spacers 120 are arranged in the photo spacers 120. And the photo spacers 120 are positioned between the substrates 110, and the shade 130 and the photo spacers 120 are disposed on the same layer.

Figure 4:
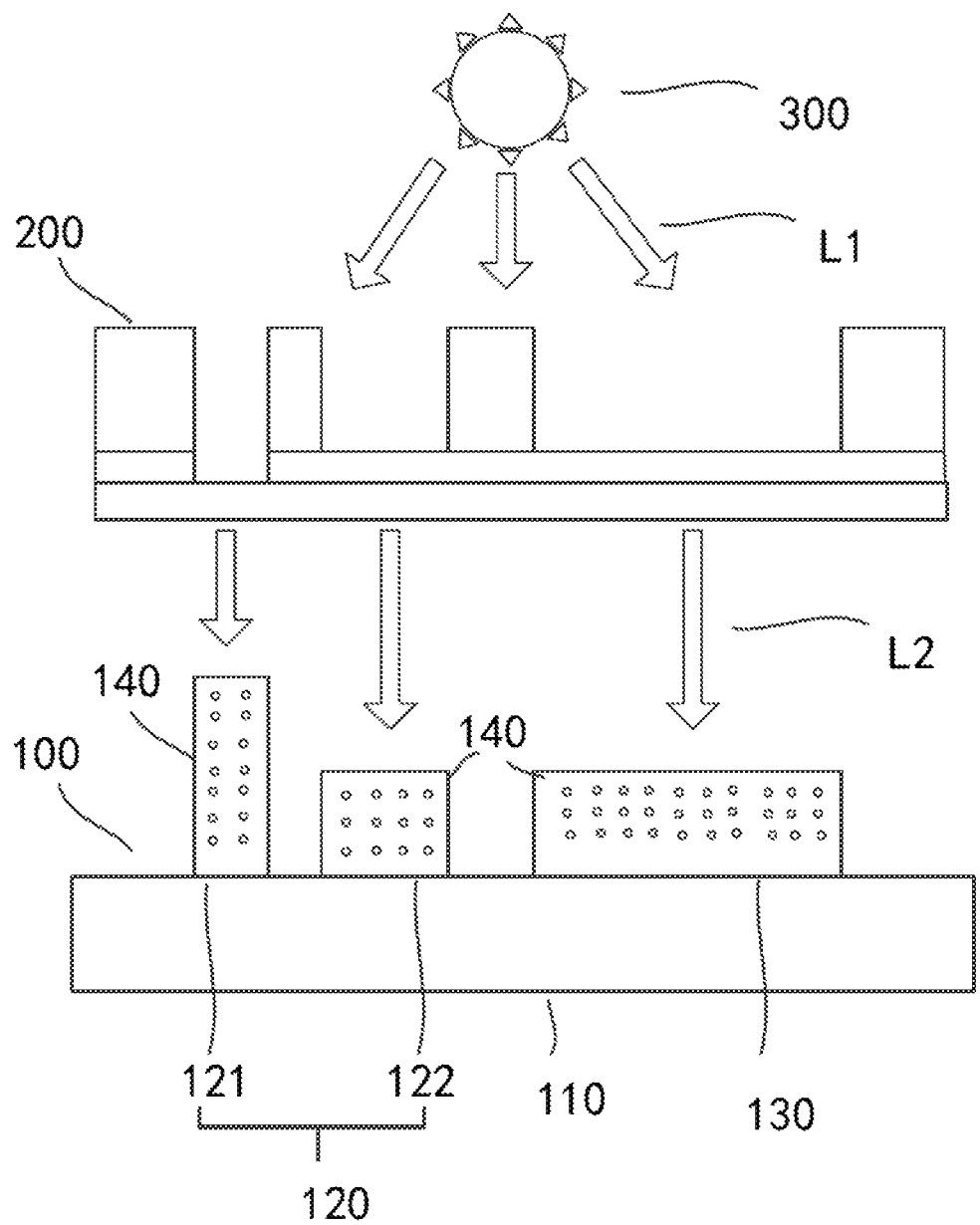
FIG. 4 is a partial process schematic diagram of a manufacturing method of a display panel in an embodiment of the present application.

In combination with FIG. 4, FIG. 4 is a partial process schematic diagram of a manufacturing method of a display panel in one or more embodiments of the present application.

In the display panel in one or more embodiments of the present application, the photo spacers 120 and the shade 130 are disposed on the same layer of the substrate 110, so that in the manufacturing method of the display panel 100, the photo spacers 120 and the shade 130 may be processed simultaneously, to save manufacturing techniques of the display panel 100.

Furthermore, in one or more embodiments of the present application, the photo-initiators 140 are further arranged in the photo spacers 120. The photo-initiators 140 are configured to cooperate with preset wavelength of light rays. Irradiated by different wavelengths of light rays, the photo-initiators produce different cross-linking reactions with the different photo spacers 120. Specifically, irradiated by different wavelengths of the light rays, the photo-initiators 140 produce different cross-linking reactions with the different photo spacers 120, so that the shrinkages of the different photo spacers 120 are different, thereby controlling mismatch between every two photo spacers 120 to be within an appropriate range, and making the mismatch between every two photo spacers 120 meet various design requirements.

In this way, an embodiment of the present application not only reduces manufacturing methods of display panels, but also facilitates controlling shrinkages of different photo spacers, and then facilitates controlling the mismatch between different photo spacers, that is, controlling the height difference between every two photo spacers.

In one or more embodiments of the present application, specifically, the photo spacers 120 includes at least two of the photo spacers including a first photo spacer 121 and a second photo spacer 122 mismatched with the first photo spacer 121, and photo-initiators in the photo spacers 120 are identical. Identical photo-initiators are arranged in different photo spacers. Irradiated by different wavelengths of light rays, the different photo spacers produce different degrees of cross-linking reactions, so that the different photo spacers form different degrees of shrinkages, thereby achieving that a mismatch forms between different photo spacers. In one or more embodiments of the present application, different wavelengths of the light rays are configured to irradiate the identical photo-initiators and the photo spacers, and the different photo spacers are controlled to produce different degrees of the cross-linking reactions under the effect of the light rays of different wavelengths, so as to further control the shrinkages of the different photo spacers. Control effect is good, so that the mismatch between the different photo spacers achieves a preset need. Furthermore, for such configuration on a production technique, the different photo spacers are not required to be configured differently, and the configuration thereof is simple.

Further, the photo-initiator 140 is arranged in the shade 130. The shade 130 in one or more embodiments of the present application is equivalent to the light shading layer [black matrix layer (BM layer)] in the display panel in the prior art. Because the identical photo-initiator 140 are arranged in the photo spacer 120 and the shade 130, when being irradiated by different wavelengths of light rays, the shade 130 also produces a cross-linking reaction with the photo-initiator 140, to form a shrinkage so as to control the height of the shade 130.

Furthermore, the shade 130 is configured to have an equal height to the second photo spacer 122, the first photo spacer is configured to be higher than the second photo spacer, and the second photo spacer is positioned between the first photo spacer and the shade. In one or more embodiments of the present application, the first photo spacer 121 is configured to be higher than the second photo spacer 122 and the shade 130, the second photo spacer 122 is configured to have an equal height to the shade 130, and the heights of the first photo spacer 121, the second photo spacer 122 and the shade 130 are better controlled, i.e., the control for the mismatch is better, so that the display of the display panel is better.

In one or more embodiments of the present application, the mismatch value between the first photo spacer 121 and the second photo spacer 122 is greater than or equal to 0.5 um. Specifically, the height difference between the height H1 of the first photo spacer 121 and the height H2 of the second photo spacer 122 is greater than or equal to 0.5 um. When the mismatch value between the first photo spacer 121 and the second photo spacer 122 is less than 0.5 um, the display of the display panel is greatly affected, and other manufacturing methods are affected, so that the difficulty of the entire display panel is increased. In the present application, the shrinkages of the different photo spacers are controlled under the cooperation between different wavelengths of the light rays and the photo-initiator 140, to control the mismatch between the first photo spacer 121 and the second photo spacer 122 to be greater than or equal to 0.5 um, thereby facilitating the successful manufacture of the entire display panel and avoiding affecting the display of the display panel due to a limited mismatch value. In one or more embodiments of the present application, optionally, the mismatch value between the first photo spacer 121 and the second photo spacer 122 is between 0.5 um and 0.6 um, that is, the height difference between H1 and H2 is between 0.5 um and 0.6 um.

In one or more embodiments of the present application, optionally, identical photo-initiators are added into the photo spacers and the shade. Irradiated by different wavelengths of light rays, the different photo spacers and the shade form different degrees of shrinkages. However, it should be noted that other manners may be used in one or more embodiments of the present invention.

For example, the photo-initiators in all photo spacers are different. Different photo-initiators correspond to different wavelengths of light rays respectively. The different wavelengths of light rays cooperate with the different photo-initiators respectively. Thus, irradiated by different wavelengths of light rays, the different photo-initiators produce different degrees of cross-linking reactions with the different photo spacers respectively, so that different degrees of shrinkages are formed, thereby achieving that a mismatch is formed between different photo spacers.

For example, the photo-initiators in all the photo spacers and the shade are different. Different photo-initiators correspond to different wavelengths of light rays respectively. The different wavelengths of light rays cooperate with the different photo-initiators respectively. Thus, irradiated by different wavelengths of light rays, the different photo-initiators produce different degrees of cross-linking reactions with the different photo spacers and the shade respectively, so that different degrees of shrinkages are formed, to control the heights of the different photo spacers and the shade.

In one or more embodiments of the present application, both the photo spacers 120 is made from a same material as the shade 130. In this way, in the manufacturing method of the display panel, the manufacturing method is simpler and more convenient. Further, in one or more embodiments of the present application, optionally, the photo spacers and the shade are made of black color filter spacer (BCS) material which not only can play a support role, but also has good light shading performance. However, it should be noted that the photo spacers and the shade In one or more embodiments of the present invention may also be made of other material.

As shown in FIG. 4 to FIG. 8, an embodiment of the present application discloses a manufacturing method of a display panel. In combination with FIG. 2 and FIG. 3, the display panel 100 includes substrates 110. The manufacturing method includes the following steps:

doping a photo-initiator 140 in photoresist for manufacturing photo spacers 120;

coating the photoresist on the substrates 110 to form photo spacers 120, and arranging a shade 130 on the same layer; and respectively irradiating corresponding photo spacers 120 by at least two types of light rays of different wavelengths, to control the photo-initiator 140 so as to enable different photo spacers 120 to have different shrinkages.

Figure 5:
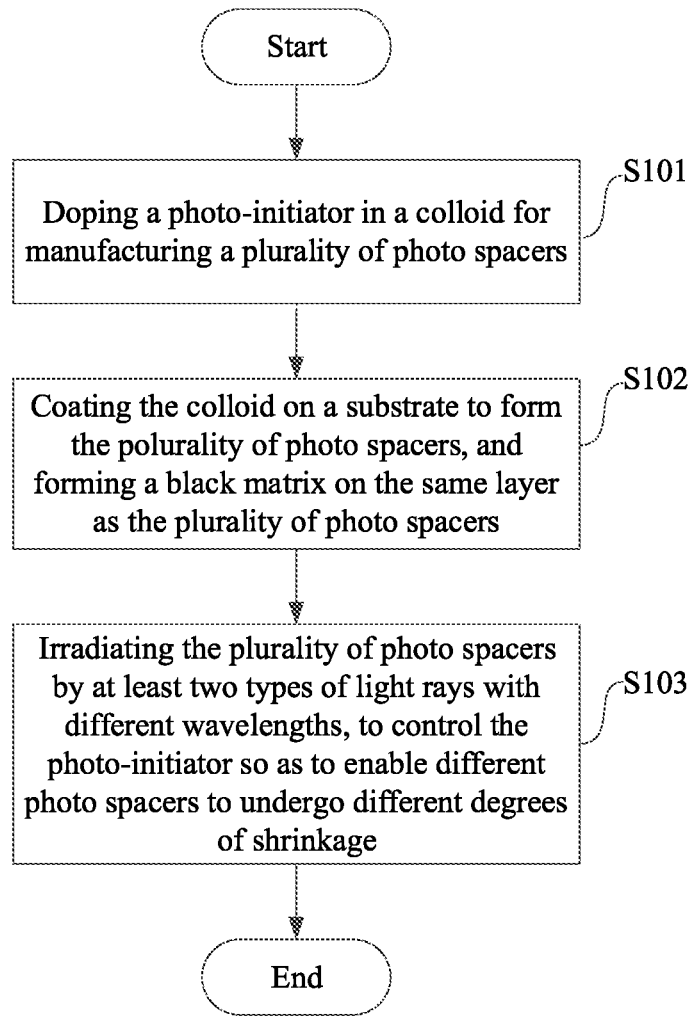
FIG. 5 is a flowchart of a manufacturing method of a display panel in an embodiment of the present application.

FIG. 4 is a partial process schematic diagram of a manufacturing method of a display panel in one or more embodiments of the present application, and FIG. 5 is a flowchart of a manufacturing method of a display panel in one or more embodiments of the present application.

As shown in FIG. 5, in combination with FIG. 4, the manufacturing method of the display panel in one or more embodiments—of the present application includes step S101, step S102 and step S103.

Specifically, step S101: doping a photo-initiator 140 in photoresist for manufacturing photo spacers 120;

step S102: coating the photoresist on the substrates 110 to form photo spacers 120, and arranging a shade 130 on the same layer; and step S103: respectively irradiating corresponding photo spacers by at least two types of light rays of different wavelengths, to control the photo-initiator so as to enable different photo spacers to have different shrinkages.

Figure 6:
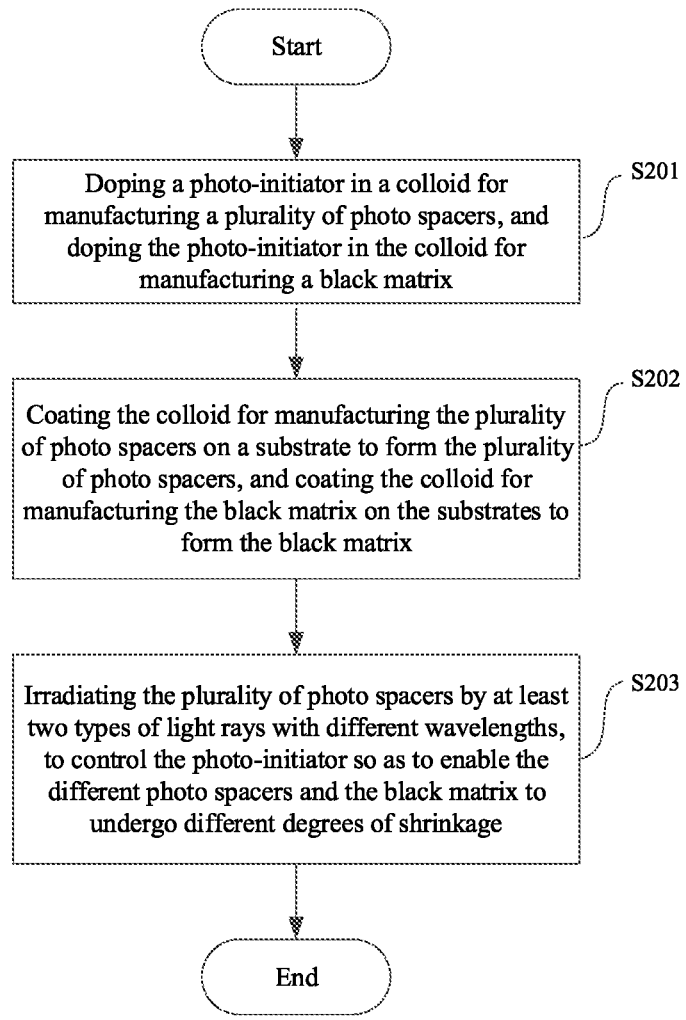
FIG. 6 is a flowchart of a manufacturing method of a display panel in an embodiment of the present application.

As shown in FIG. 6, FIG. 6 is a flowchart of another manufacturing method of a display panel in one or more embodiments of the present application. In combination with FIG. 4, the manufacturing method of the display panel in one or more embodiments of the present application includes step S201, step S202 and step S203.

Specifically, step S201: doping a photo-initiator 140 in photoresist for manufacturing photo spacers 120 and doping the photo-initiator in photoresist for manufacturing shades.

step S202: coating the photoresist for manufacturing photo spacers on the substrates 110 to form photo spacers 120 and coating the photoresist for manufacturing shades on the substrates 110 to form the shade 130.

step S203: respectively irradiating corresponding photo spacers and the shade by at least two types of light rays of different wavelengths, to control the photo-initiator so as to enable different photo spacers to have different shrinkages.

Figure 7:
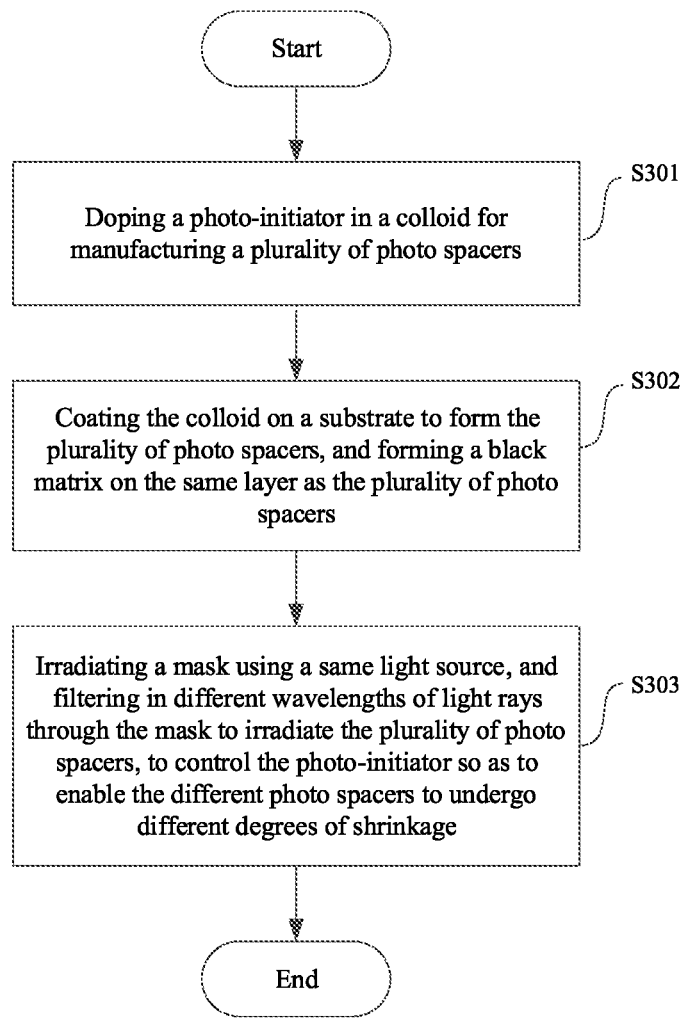
FIG. 7 is a flowchart of a manufacturing method of a display panel in an embodiment of the present application.

As shown in FIG. 7, FIG. 7 is a flowchart of another manufacturing method of the display panel in one or more embodiments of the present application. In combination with FIG. 4, the manufacturing method of the display panel in one or more embodiments the present application includes step S301, step S302 and step S303.

Specifically, step S301: doping a photo-initiator 140 in photoresist for manufacturing photo spacers 120;

step S302: coating the photoresist for manufacturing photo spacers on the substrates 110 to form photo spacers 120;

step S303: respectively irradiating corresponding photo spacers by at least two types of light rays of different wavelengths, specifically, irradiating a mask using the same light source 300, and filtering out light rays of different wavelength through use of the mask, to control the photo-initiator so as to enable different photo spacers to have different shrinkages.

Figure 9:
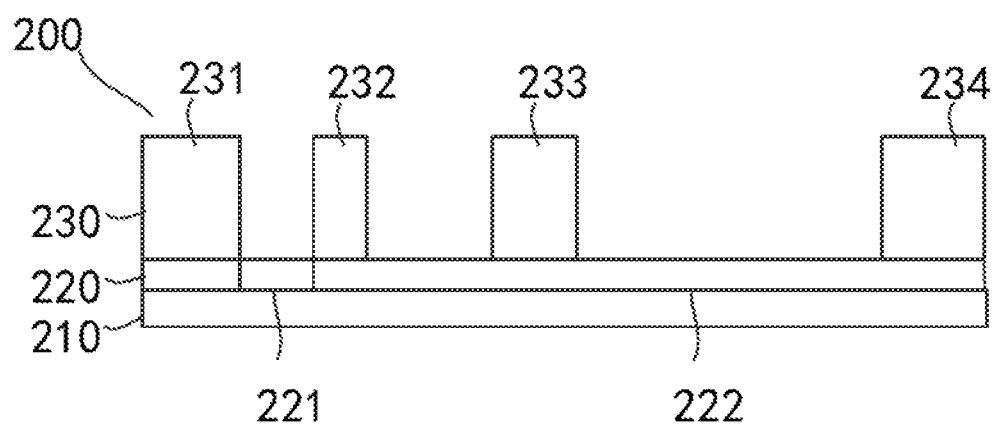
FIG. 9 is a structural schematic diagram of a mask in an embodiment of the present application.

See FIG. 9 for the mask in the manufacturing method of the display panel in one or more embodiments of the present application.

In this way, in the manufacturing method of the display panel, the same light source 300 may be directly used, so that the light source is simply used without irradiating for many times using different light sources. For the same light source, under the filtering action of the mask 200, different wavelengths of light rays are filtered, and then the shrinkages of different photo spacers are controlled by the cooperation between different wavelengths of the light rays and the photo-initiator, to control the mismatch between the first photo spacer and the second photo spacer.

More specifically, the light source 300 emits a first group of light rays L1, the first group of light rays L1 have a plurality of light rays of different wavelengths irradiating on the mask 200, the mask 200 filters the first group of light rays L1, a second group of light rays L2 passing through the mask 200 have two different wavelengths, and two different wavelengths of the light rays respectively irradiate on the first photo spacer 121 and the second photo spacer 122, so that the photo-initiators 140 in the first photo spacer 121 and the second photo spacer 122 produce different degrees of cross-linking reactions, thus forming different degrees of shrinkages.

Figure 8:
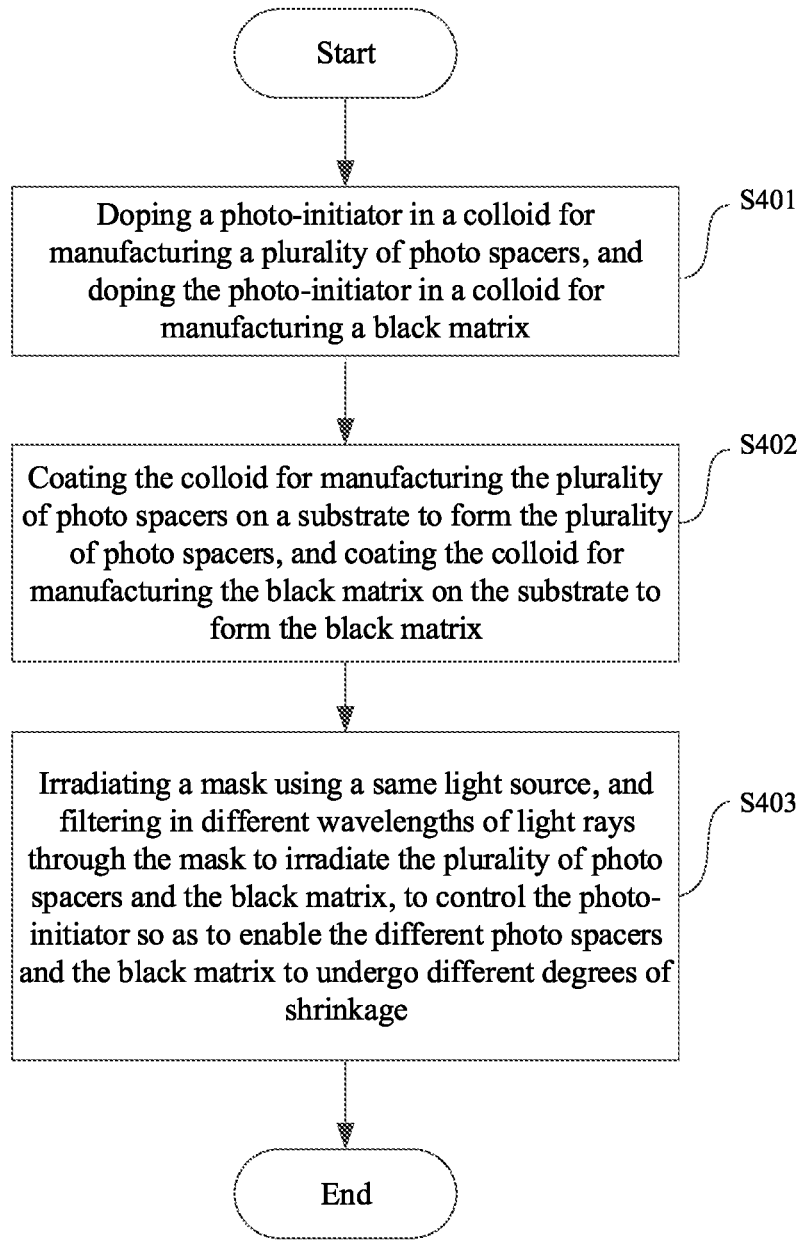
FIG. 8 is a flowchart of a manufacturing method of a display panel in an embodiment of the present application.

As shown in FIG. 8, FIG. 8 is a flowchart of yet another manufacturing method of the display panel in one or more embodiments—of the present application. In combination with FIG. 4, the manufacturing method of the display panel in one or more embodiments of the present application includes step S401, step S402 and step S403.

Specifically, step S401: doping a photo-initiator 140 in photoresist for manufacturing photo spacers 120 and doping the photo-initiator in photoresist for manufacturing shades.

step S402: coating the photoresist for manufacturing photo spacers on the substrates 110 to form photo spacers 120 and coating the photoresist for manufacturing shades on the substrates 110 to form the shade 130.

step S403: respectively irradiating corresponding photo spacers by at least two types of light rays of different wavelengths, specifically, irradiating a mask 200 using the same light source 300, filtering out light rays of different wavelength through the mask 200, to control the photo-initiator so as to enable different photo spacers to have different shrinkages.

See FIG. 9 for the mask in the manufacturing method of the display panel in one or more embodiments of the present application.

In this way, in the manufacturing method of the display panel, the same light source 300 may be directly used, so that the light source is simply used without irradiating for many times using different light sources. For the same light source, under the filtering action of the mask 200, different wavelengths of light rays are filtered, and then the shrinkages of different photo spacers and shades are controlled by the cooperation between different wavelengths of the light rays and the photo-initiator, to control the mismatch between the first photo spacer and the second photo spacer and control the height of the shade.

More specifically, the light source 300 emits a first group of light rays L1, the first group of light rays L1 have a plurality of light rays of different wavelengths irradiating on the mask 200, the mask 200 filters the first group of light rays L1, a second group of light rays L2 passing through the mask 200 have two different wavelengths, and two different wavelengths of the light rays respectively irradiate on the first photo spacer 121 and the second photo spacer 122, so that photo-initiators 140 in the first photo spacer 121 and the second photo spacer 122 produce different degrees of cross-linking reactions, thus forming different degrees of shrinkages. Light rays of one wavelength irradiate the first photo spacer 121, and light rays of the other wavelength irradiate on the second photo spacer and the shade, so that in the case where the photo spacers are made from a same material as the shade, the second photo spacer may have an equal height to the shade.

Both the photo spacers 120 is made from a same material as the shade 130, that is, the photo spacers and the shade may be made of the same colloid. In this way, in the manufacturing method of the display panel, the manufacturing method is simpler and more convenient. Further, in one or more embodiments of the present application, optionally, the photo spacers and the shades are made of black color filter spacer (BCS) material which not only can play a support role, but also has good light shading performance. However, it should be noted that the photo spacers and shade in one or more embodiments of the present invention can also be made of other material.

In the manufacturing method of the display panel in one or more embodiments of the present application, the photo spacers 120 and the shade 130 are disposed on the same layer of the substrate 110, so that in the manufacturing method of the display panel 100, as shown in FIG. 4, the photo spacers 120 and the shade 130 may be processed simultaneously in one manufacturing method, to save manufacturing techniques of the display panel 100.

Furthermore, in one or more embodiments of the present application, the photo-initiators 140 are arranged in the photo spacers 120. The photo-initiators 140 are configured to cooperate with preset wavelength of light rays. Irradiated by different wavelengths of light rays, the photo-initiators produce different cross-linking reactions with different photo spacers 120. Specifically, irradiated by different wavelengths of the light rays, the photo-initiators 140 produce different cross-linking reactions with the different photo spacers 120, so that the shrinkages of the different photo spacers 120 are different, thereby controlling the mismatch between every two photo spacers 120 to be within an appropriate range, and making the mismatch between every two photo spacers 120 meet various design requirements.

In this way, an embodiment of the present application not only reduces manufacturing methods of display panels, but also facilitates controlling shrinkages of different photo spacers, and then facilitates controlling the mismatch between different photo spacers, that is, controlling the height difference between every two photo spacers. Thus, the manufacturing method of the display panel is simple, and the display of the display panel is better.

In a manufacturing method of the display panel of the present application, irradiated by different wavelengths of light rays, the mismatch value between the first photo spacer 121 and the second photo spacer 122 is greater than or equal to 0.5 um. Specifically, the height difference between the height H1 of the first photo spacer 121 and the height H2 of the second photo spacer 122 is greater than or equal to 0.5 um. When the mismatch value between the first photo spacer 121 and the second photo spacer 122 is less than 0.5 um, the display of the display panel is greatly affected, and other manufacturing methods are affected, so that the difficulty of the entire display panel is increased. In the present application, the shrinkages of the different photo spacers are controlled under the cooperation between different wavelengths of the light rays and the photo-initiator 140, to control the mismatch between the first photo spacer 121 and the second photo spacer 122 to be greater than or equal to 0.5 um, thereby facilitating the successful manufacturing of the entire display panel and avoiding affecting the display of the display panel due to a limited mismatch value. In one or more embodiments of the present application, optionally, the mismatch value between the first photo spacer 121 and the second photo spacer 122 is between 0.5 um and 0.6 um, that is, the height difference between H1 and H2 is between 0.5 um and 0.6 um.

Further, in one or more embodiments of the present application, the first photo spacer 121 is configured to be higher than the second photo spacer 122 and the shade 130, the second photo spacer 122 is configured to have an equal height to the shade 130, and the heights of the first photo spacer 121, the second photo spacer 122 and the shade 130 are better controlled, i.e., the control for the mismatch is better, so that the display of the display panel is better.

As shown in FIG. 9, an embodiment of the present application discloses a mask 200. The mask 200 is applied to the above manufacturing method of the display panel. In combination with FIG. 2 to FIG. 8, the mask 200 includes:

a light filter layer 220, comprising at least three light filter portions including a first light filter portion 221 corresponding to the first photo spacer, a second light filter portion 222 corresponding to the second photo spacer 122 and a third light filter portion corresponding to the shade 130, where the first light filter portion 221 is only used for light rays of a first wavelength to pass through, and the second light filter portion 222 and the third filter portion are only used for light rays of second wavelength to pass through;

a light shading layer 230, including at least four light shading blocks, specifically, a first light shading block 231, a second light shading block 232, a third light shading block 233 and a fourth light shading block 234, where the first light filter portion 221 is positioned between the first light shading block 231 and the second light shading block 232, the second light filter portion 222 is positioned between the second light shading block 232 and the third light shading block 233, and the third light filter portion is positioned between the third light shading block 233 and the fourth light shading block 234; and a carrier 210 transparently arranged, wherein where the light filter layer 220 and the light shading layer 230 are disposed on the carrier 210.

The carrier includes a transparent glass substrate, that is to say, the carrier directly uses the glass substrate for support, the glass substrate plays a support role and bears the light shading layer and the light filter layer, and the transparent glass substrate has a good transparent effect. Moreover, the glass substrate in the mask of the present application may be made of quartz glass which is easily obtained. However, the carrier may use other object for bearing, for example, the carrier includes a metal film, that is, the carrier uses the metal film for bearing, where the metal film is provided with a through hole for light rays to pass through. The metal film plays a support role and bears the first light shading layer and the light filter layer, and the metal film has high intensity and has a good bearing effect. Furthermore, the through hole is provided in the metal film for light rays to pass through.

The light shading layer is disposed on the light filter layer, and such arrangement has a good effect, so that the light shading effect of the light shading is better. Of course, it should be noted that the light shading layer of the present application may be directly disposed on the carrier, that is, both the light shading layer and the light filter layer are directly disposed on the carrier. Such arrangement may save space occupied by the light filter layer and save light filter layer material.

The light filter portion includes a metal grating used for preset wavelength of light rays to pass through. The metal grating filter preset wavelength of light rays, and only allows preset wavelength of the light rays to pass through, to filter out other wavelength of light rays, so as to prevent other wavelength of the light rays from passing through. It should be noted that the light filter portion in the present embodiment is not limited to the metal grating, may also include a transparent medium used for preset wavelength of light rays to pass through. The transparent medium allows preset wavelength of light rays to pass through, in other words, the transparent medium allows light rays with the same color to pass through; and absorbs other wavelengths of light rays, so as to prevent other wavelengths of the light rays from passing through, in other words, absorbs other colors of light rays, so as to prevent other colors of light rays from passing through. Further, when the light filter portion includes a metal grating and a transparent medium which are stacked. In the present embodiment, optionally, the metal grating is stacked on the transparent medium. Here, the metal grating is stacked on the transparent medium, to guarantee that transparent areas may be completely overlapped, so as to enable the metal grating and the transparent medium to act together. The metal grating achieves filtration and the transparent medium achieves absorption. In this way, the light filter effect is better. The metal grating may be made of nickel or other material. The transparent medium may be made of polymethyl methacrylate (PMMA) or other material. Of course, it should be noted that the transparent medium may be stacked on the metal grating as well.

The present application further discloses a display apparatus. The display apparatus includes a display panel manufacturing through the above manufacturing method of the display panel and a backlight module, and the display apparatus may be a liquid crystal display apparatus and may be an OLED display apparatus as well. When the display apparatus in one or more embodiments of the present application is a liquid crystal display apparatus, backlight modules may be used as light sources configured to supply sufficient brightness and uniformly distributed. The backlight module in the present embodiment may be of a front light type and may be of a backlight type as well. It should be noted that the backlight module in the present embodiment is not limited thereto.

The above contents are further detailed descriptions of the present application in combination with specific optional embodiments. However, the specific implementation of the present application shall not be considered to be only limited to these descriptions. For those of ordinary skill in the art to which the present application belongs, several simple deductions or replacements may be made without departing from the conception of the present application, all of which shall be considered to belong to the protection scope of the present application.

What is claimed is:

1. A mask applied to a manufacturing method of a display panel, wherein the manufacturing method comprises: doping a photo-initiator in a photoresist for manufacturing a plurality of photo spacers and a black matrix; coating the photoresist on a substrate to form the plurality of photo spacers and the black matrix in a same layer; and irradiating the photoresist with a pattern including the black matrix and the plurality of photo spacers with at least two types of light rays of different wavelengths, to control the photo-initiator to enable different photo spacers and the black matrix to undergo different degrees of shrinkage;

wherein the step of irradiating the photoresist with the pattern including the black matrix and the plurality of photo spacers with at least two types of light rays of different wavelengths to control the photo-initiator to enable different photo spacers and the black matrix to undergo different degrees of shrinkage comprises: irradiating a mask with a single light source to filter the different wavelengths of light rays passing through the mask and performing development; wherein the plurality of photo spacers comprise at least two photo spacers including a first photo spacer and a second photo spacer that has a different height than the first photo spacer, wherein the photo-initiator in the first photo spacer is identical with that in the second photo spacer and that in the black matrix, wherein the first photo spacer is irradiated only with a light ray of a first wavelength, and the second photo spacer is irradiated only with a light ray of a second wavelength, the first wavelength being different than the second wavelength;

wherein the black matrix is configured to have an equal height to the second photo spacer, wherein the first photo spacer has a greater height than the second photo spacer, and the second photo spacer is positioned between the first photo spacer and the black matrix; and a height difference between the first photo spacer and the second photo spacer is greater than or equal to 0.5 µm;

wherein each first photo spacer is directly arranged on the substrate, each second photo spacer is directly arranged on the substrate, and the black matrix is directly arranged on the substrate; wherein each first photo spacer, each second photo spacer, and the black matrix are spaced apart and separated from each other at intervals without being connected to each other;

wherein the mask comprises:

a light filter layer comprising at least three light filter portions including a first light filter portion corresponding to the first photo spacer, a second light filter portion corresponding to the second photo spacer, and a third light filter portion corresponding to the black matrix, wherein the first light filter portion is only used for the first wavelength of light rays to pass through, and the second light filter portion and the third filter portion are only used for the second wavelength of light rays to pass through;

a light shading layer comprising a first light shading block, a second light shading block, a third light shading block and a fourth light shading block, wherein the first light filter portion is positioned between the first light shading block and the second light shading block, the second light filter portion is positioned between the second light shading block and the third light shading block, and the third light filter portion is positioned between the third light shading block and the fourth light shading block; and a carrier allowing light rays to pass through, wherein the light filter layer and the light shading layer are disposed on the carrier;

wherein the light filter layer comprises a metal grating and a colored transparent medium that are each used for allowing light rays of preset wavelengths to pass through, and wherein the metal grating is stacked on the colored transparent medium, wherein the colored transparent medium is used for a preset wavelength of light rays to pass through, or is used to allow light rays with a same color as the colored transparent medium to pass through, while absorbing other wavelengths of light rays thus preventing the other wavelengths of the light rays from passing through.

2. The mask according to claim 1, wherein the light filter layer is directly disposed on the carrier, and the light shading layer is directly disposed on the light filter layer.

3. The mask according to claim 1, wherein the light filter layer is directly disposed on the carrier, the light shading layer is directly disposed on the carrier, and the at least three light filter portions are arranged among the plurality of light shading layers at intervals.

4. The mask according to claim 3, wherein the colored transparent medium is made of polymethyl methacrylate (PMMA).

5. The mask according to claim 1, wherein the carrier is a metal film, wherein the metal film is provided with a through hole for light rays to pass through.

6. The mask according to claim 1, wherein the light filter layer and the light shading layer are each directly disposed on the carrier.

* * * * *